(12) United States Patent
Morita et al.

(10) Patent No.: US 9,825,109 B2
(45) Date of Patent: Nov. 21, 2017

(54) DISPLAY DEVICE

(71) Applicant: Japan Display Inc., Tokyo (JP)

(72) Inventors: Takeomi Morita, Tokyo (JP); Takahide Kuranaga, Tokyo (JP); Norio Oku, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/668,469

(22) Filed: Mar. 25, 2015

(65) Prior Publication Data

US 2015/0279915 A1  Oct. 1, 2015

(30) Foreign Application Priority Data

Mar. 31, 2014  (JP) .................................. 2014-071441

(51) Int. Cl.
*H01L 27/32* (2006.01)
*H01L 51/52* (2006.01)

(52) U.S. Cl.
CPC ...... *H01L 27/3258* (2013.01); *H01L 27/3213* (2013.01); *H01L 27/3246* (2013.01); *H01L 51/5234* (2013.01); *H01L 51/5253* (2013.01)

(58) Field of Classification Search
CPC .................................................. H01L 27/3211
See application file for complete search history.

(56) References Cited

U.S. PATENT DOCUMENTS

| | | | | |
|---|---|---|---|---|
| 6,781,162 | B2 * | 8/2004 | Yamazaki et al. | ............ 257/184 |
| 8,598,782 | B2 * | 12/2013 | Shinto | ............................ 313/504 |
| 8,921,867 | B2 * | 12/2014 | Okumoto et al. | ............... 257/72 |
| 2003/0137325 | A1 | 7/2003 | Yamazaki et al. | |
| 2008/0218061 | A1 * | 9/2008 | Chao et al. | .................... 313/504 |
| 2009/0009069 | A1 * | 1/2009 | Takata | ................ H01L 27/3246 313/504 |
| 2009/0194780 | A1 | 8/2009 | Kwon | |
| 2009/0309489 | A1 * | 12/2009 | Takata | ................ H01L 27/3246 313/504 |

(Continued)

FOREIGN PATENT DOCUMENTS

| | | |
|---|---|---|
| CN | 101340754 A | 1/2009 |
| CN | 102214796 A | 10/2011 |

(Continued)

OTHER PUBLICATIONS

Examiner's Notice of Reason for Rejection issued by KIPO on Jun. 15, 2016 for Counter Korean Application: 10-2015-0037925 with partial English translation.

(Continued)

*Primary Examiner* — Eugene Lee
(74) *Attorney, Agent, or Firm* — Typha IP LLC

(57) ABSTRACT

A display device is provided including a first substrate provided with a pixel, the pixel being provided with a light emitting region of a light emitting device formed by stacking a first electrode, a light emitting layer and second electrode in this order, a first insulating layer having an opening exposing the first electrode at a position corresponding to the light emitting region and provided above the first electrode, a second insulating layer having a certain thickness provided over the first insulating layer and outer region of the opening, and a sealing film provided covering the light emitting device above the second electrode.

12 Claims, 8 Drawing Sheets

(56) References Cited

U.S. PATENT DOCUMENTS

| | | |
|---|---|---|
| 2010/0171106 A1 | 7/2010 | Jung et al. |
| 2013/0248867 A1 | 9/2013 | Kim et al. |
| 2014/0027729 A1 | 1/2014 | So et al. |
| 2014/0117341 A1* | 5/2014 | Song et al. .............. 257/40 |

FOREIGN PATENT DOCUMENTS

| | | |
|---|---|---|
| JP | 2005-322564 A | 11/2005 |
| JP | 2008-147072 A | 6/2008 |
| JP | 2011-171268 A | 9/2011 |
| JP | 2013-077382 A | 4/2013 |
| KR | 10-0793546 A | 1/2008 |
| KR | 10-2009-0004672 A | 1/2009 |
| KR | 10-2009-0084202 A | 8/2009 |
| KR | 10-2010-0081773 A | 7/2010 |
| KR | 10-2010-0125502 A | 12/2010 |
| KR | 10-2012-0030723 A | 3/2012 |
| KR | 10-2013-0107883 A | 10/2013 |
| KR | 10-2014-0015037 A | 2/2014 |

OTHER PUBLICATIONS

KIPO Examiner's Notice of Decision of Rejection dated Sep. 21, 2016 for counter Korean Application No. 10-2015-0037925, with partial English translation.
Chinese Office Action dated Jun. 2, 2017 for corresponding CN Patent Application No. 201510126092.2, with partial translation.

* cited by examiner

DISPLAY DEVICE

CROSS REFERENCE TO RELATED APPLICATIONS

This application is based upon and claims the benefit of priority from the prior Japanese Patent Application No. 2014-071441, filed on Mar. 31, 2014, the entire contents of which are incorporated herein by reference.

FIELD

The present invention is related to a display device using a light emitting device.

BACKGROUND

An organic electroluminescence device (referred to below as "organic EL device") which uses an organic electroluminescence material can emit light in each color of the visible light band which is originally white emitted light by selecting the organic material or adopting an appropriate structure for the light emitting device. As a result, the development of display devices or lighting which use light emitting device is progressing.

A display device which uses a light emitting device is provided with light emitting devices in each pixel which are connected to a transistor and the emitted light is controlled by the transistor. The light emitting device is formed in a device substrate formed with the transistor. The display device is formed including a pixel array in which these type of pixels are provided in a matrix shape and the light emitted from the light emitting device is emitted to an opposing substrate which is provided facing the device substrate or above the device substrate and thereby a display screen is formed on the surface.

In the structure of a pixel, an interlayer insulating layer is generally provided between a light emitting device and a transistor. In addition, the light emitting device is provided with a layer including an organic electro-luminescence material (referred to below as "light emitting layer") between a pair of electrodes as a light emitting material and one of the electrodes of the light emitting device is electrically connected with a source-drain electrode of the transistor in a contact hole formed in the interlayer insulating layer. In addition, because the light emitting device rapidly deteriorates when exposed to oxygen etc., the surface is sometimes covered using a sealing layer comprised from silicon nitride and the like.

When external stress is applied to a display device provided with this type of structure, interlayer peeling sometimes occurs at the boundary between the light emitting layer and electrode etc. included in the light emitting device or at the boundary between a sealing layer and light emitting device.

In order to control this peeling problem, the display device disclosed in Japanese Laid Open Patent No. 2013-077382 attempts to increase adhesion at the boundary between layers by forming a plurality of convex structured bodies using the same material as an electrode in a region sandwiched between electrodes of adjacent pixels, forming each layer up to a sealing layer from an organic compound layer above the convex structured body and increasing the contact surface between adjacent layers in a stacking direction using a concave-convex shape formed on the surface of each layer.

The display device which uses the above mentioned conventional light emitting device attempts to control interlayer peeling by following the concave-convex shape of the convex shaped structured body of the organic compound layer, electrode and sealing layer in order to increase the surface area of adjacent interlayers in each stacked layer. However, because there is no change in adjacent layers themselves in stacked thin films when a concave-convex surface is formed in each layer, there is no change in adhesion between a layer located on a lower layer and the layers stacked above and therefore there is a danger that interlayer peeling cannot be controlled.

In addition, in the display device which uses the above mentioned conventional light emitting device, when a concave-convex surface is formed in a plurality of layers provided above a concave shaped structured body, the concave-convex shape of the surface becomes gradually smaller towards the upper layer due to the thickness of the lower layer, adhesion between adjacent layers in the stacking direction becomes weaker die to planarization of the concave-convex surface and there is a danger that interlayer peeling occurs.

Therefore, one embodiment of the present invention aims to prevent interlayer peeling between a light emitting device and an adjacent layer and provide a display device for which a high level of reliability can be secured. In addition, another aim of the present invention is to realize this simple structure without significantly modifying a manufacturing process.

SUMMARY

A display device related to one embodiment of the present invention includes a first substrate provided with a pixel, the pixel being provided with a light emitting region of a light emitting device formed by stacking a first electrode, a light emitting layer and second electrode in this order, a first insulating layer having an opening exposing the first electrode at a position corresponding to the light emitting region and provided above the first electrode, a second insulating layer having a certain thickness provided over the first insulating layer and outer region of the opening, and a sealing film provided covering the light emitting device above the second electrode, wherein the light emitting layer includes a region provided above the first insulating layer and second insulating layer and a region not provided above a side surface of the second insulating layer; and the second insulating layer and the second electrode or the sealing film are in contact in a region not provided with the light emitting layer above a side surface of the second insulating layer.

A display device related to one embodiment of the present invention includes a first substrate provided with a pixel, the pixel being provided with a light emitting region of a light emitting device formed by stacking a first electrode, a light emitting layer and second electrode in this order, a first insulating layer having an opening exposing the first electrode at a position corresponding to the light emitting region and provided above the first electrode, and a sealing film provided covering the light emitting device above the second electrode, wherein the light emitting layer is provided with a second aperture provided above the first insulating layer and exposes the first insulating layer in a region except the light emitting region, and the first insulating layer, the second electrode or the sealing layer are in contact via the second aperture of the light emitting layer.

DESCRIPTION OF EMBODIMENTS

The embodiments of the present invention are explained below while referring to the diagrams. Furthermore, the present invention is not limited to the embodiments below and various modifications may be made without departing from the scope of the invention.

The structural components of a display device 100 related to one embodiment of the invention is explained below while referring to FIG. 1 and FIG. 2.

Figure 1:
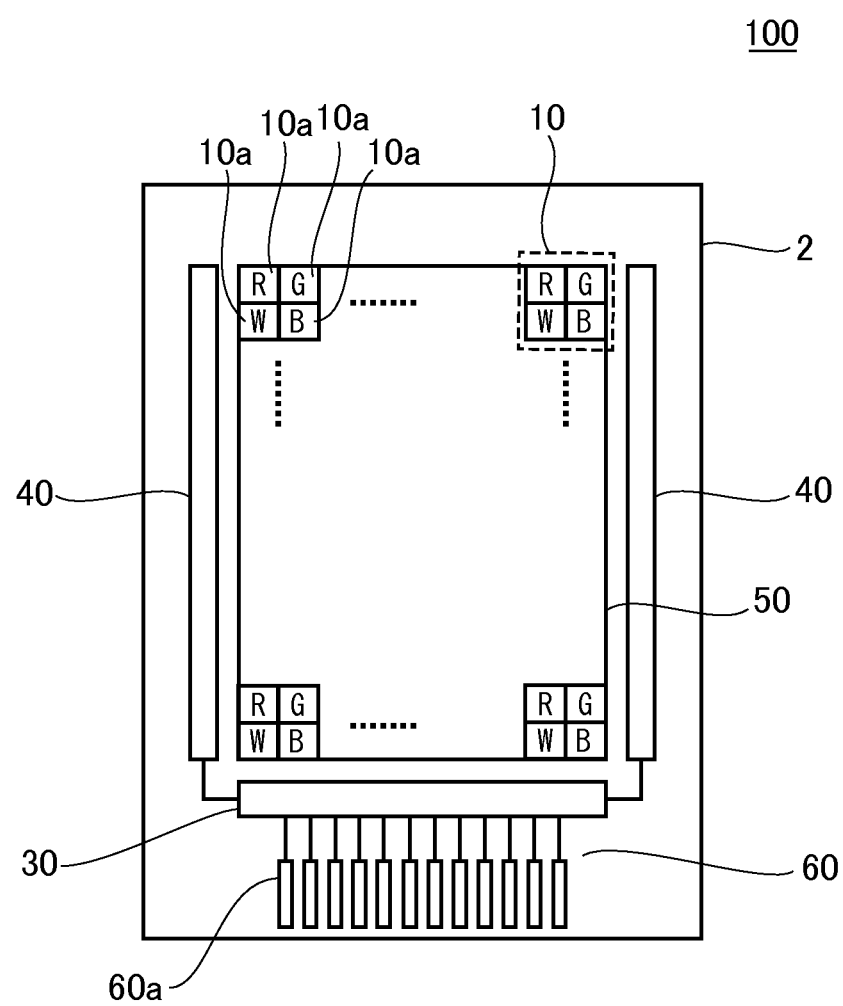
FIG. 1 is a planar diagram showing a schematic structure of a display device related to one embodiment of the present invention.

FIG. 1 is planar diagram showing a schematic structure of the display device 100 related to one embodiment of the invention. As is shown in FIG. 1, a plurality of groups of four sub-pixels 10a forming one pixel 10 emitting light in three primary colors (red (R), green (G), blue (B)) and white (W) are provided in a matrix shape at the center part of the display device 100. A display region 50 which displays an image if formed by selectively adjusting an amount of emitted light and driving each sub-pixel 10a included in the plurality of pixels 10. In addition, drive circuits (X driver, Y driver, shirt driver etc.) 30, 40 for selectively adjusting an amount of emitted light and driving each pixel 10 within the display region 10 are provided in a periphery region of the display region 50.

A plurality of control signal wires and a plurality of data signal wires which conduct electricity to each drive circuit 30, 40 are provided mutually intersecting each other in the display region 50 about a substrate 2, and the plurality of pixels 10 are provided in a matrix shape in a position corresponding to an intersection part between the control signal wires and data signal wires. A thin film transistor which controls emitted light by controlling writing of a data voltage supplied to a pixel 10 according to a control signal supplied from a control signal wire, and a pixel circuit which is provided with a capacitor device which stores a data voltage supplied from a data signal wire is provided in each pixel 10.

In addition, a plurality of wiring patterns conducting electricity to each drive circuit 30, 40 and supplying a power voltage and drive voltage to each drive circuit 30, 40 as well as performing contact to ground are formed above the substrate 2. An end part of each wiring pattern is connected to a metal electrode 60a above the substrate 2 respectively. Each metal electrode 60a may be formed as a terminal region 60 connected to a flexible printed circuit substrate (not shown in the diagram) which supplies an external drive power supply, drive signal and earth voltage etc.

Figure 2:
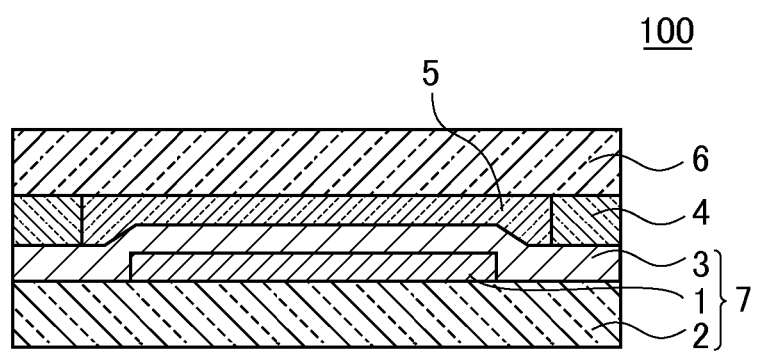
FIG. 2 is a cross-sectional diagram showing a stacked structure of a display device related to one embodiment of the present invention.

Next, a stacked structure of the display device 100 related to one embodiment of the present invention is explained while referring to FIG. 2. FIG. 2 is a vertical cross-sectional diagram showing a stacked structure of the display device 100.

FIG. 2 is a cross-sectional diagram showing a stacked structure of the display device 100 related to one embodiment of the present invention. As is shown in FIG. 2, the display device 100 is provided with a light emitting device layer 1 which forms each pixel 10 in the display region 50 above the substrate 2. The light emitting device layer 1 is formed by stacking a first electrode (anode), a light emitting layer, and a second electrode (cathode) for example in this order from the side of the substrate 2. For example, the first electrode may be a reflection electrode, the second electrode may be an electrode which allows light to pass through such as a transparent electrode. The light emitting layer is formed, for example, by stacking a hole injection layer, a hole transport layer, a light emitting layer, an electron transport layer and an electron injection layer.

Because the light emitting device layer 1 rapidly deteriorates when exposed to water in the atmosphere, it is necessary to sealing the layer from the air. In order to achieve this, for example, the surface of the light emitting device layer 1 is covered by a sealing film 3 comprised from a transparent inorganic film such as a CVD formed silicon nitride film or silicon oxide film and is also covered by a substrate 6 comprised from a transparent component. Herein, the structure in which the light emitting device layer 1 and sealing film 3 are formed above the substrate 2 is referred to as [first substrate 7] and together with this the substrate 6 is referred to as [second substrate 6]. The second substrate 6 may include a color filter and may also include a thin film device etc. provided with a touch panel function depending on the specifications of the display device 100. In addition, the first substrate 7 and second substrate 6 may be formed including a substrate comprised from a resin and may form a flexible display device 100.

As is shown in FIG. 2, a transparent resin 4, 5 such as an epoxy resin for example may be filled into an interval between the first substrate 7 and second substrate 6 in order to maintain the surfaces of the light emitting device layer 1 and second substrate 6 by maintaining a fixed distance between the two and also to prevent reflection or refraction at the boundary between the two. In addition, the interval between the first substrate 7 and second substrate 6 may be maintained using a known material such as a sealing material other than the resin 4, 5 and any structure which includes an interval between the first substrate 7 and second substrate 6 is possible as long as the interval between first substrate 7 and second substrate 6 is maintained using a sealing material etc.

The display device 100 related to the first and second embodiments of the present invention having this structure are explained.

First Embodiment

The display device 100 related to the present embodiment is described while referring to FIG. 3A, FIG. 3B, FIG. 4A and FIG. 4B.

Figure 3A:
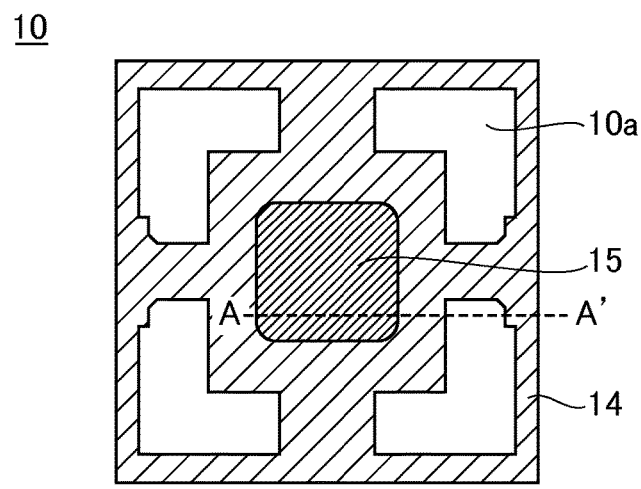
FIG. 3A is a planar diagram showing a schematic structure of a pixel included in a display device related to one embodiment of the present invention.
Figure 3B:
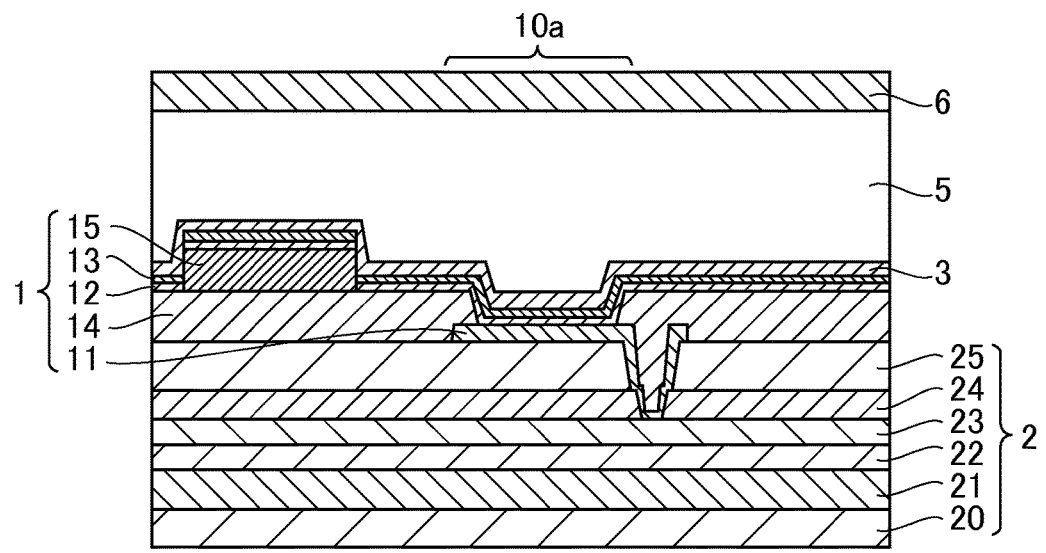
FIG. 3B shows a schematic structure of a pixel included in a display device related to one embodiment of the present invention, and is a cross-sectional diagram of the line A-A' shown in FIG. 3A.
Figure 4A:
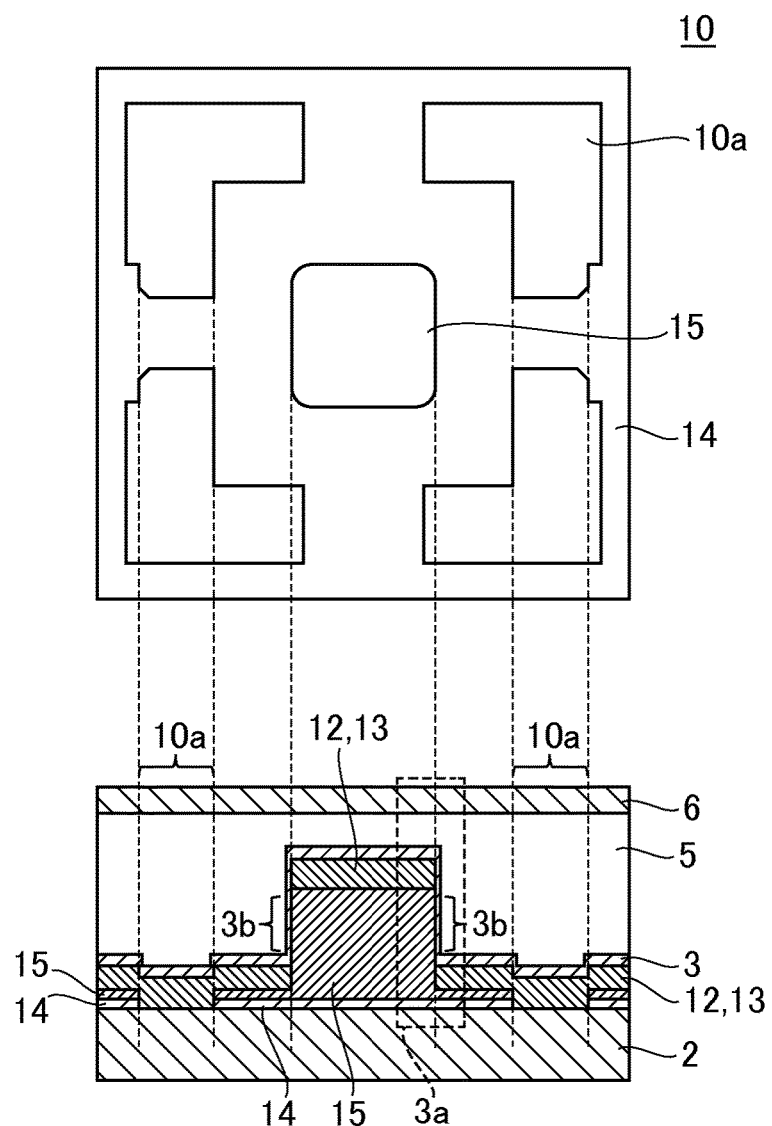
FIG. 4A is a diagram showing a schematic structure of a pixel included in a display device related to one embodiment of the present invention.
Figure 4B:
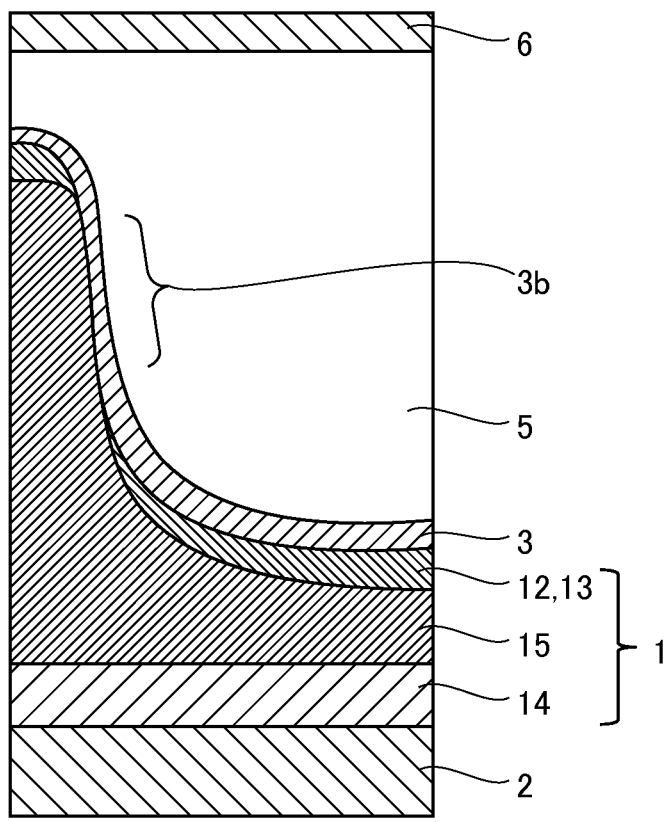
FIG. 4B is a cross-sectional diagram showing a schematic structure of a pixel included in a display device related to one embodiment of the present invention.

FIG. 3A and FIG. 3B show a schematic structure of the pixel 10 included in the display device 100 related to the first embodiment of the present invention. FIG. 3A is a planar diagram of the pixel 10 and FIG. 3B is a cross-sectional diagram of the line A-A' shown in FIG. 3A. FIG. 4A is a diagram showing a schematic structure of the pixel 10 included in the display device 100 related to the first embodiment of the present invention and shows a planar view of a pixel 10 correlated with a cross-sectional view of the pixel 10. FIG. 4B is a cross-sectional diagram showing a schematic structure of a pixel 10 included in the display device 10 related to the first embodiment of the present invention and is an enlarged cross-sectional view of the part enclosed by the dotted line 3a shown in FIG. 3A.

As is shown in FIG. 3A, a pixel 10 included in the display device 100 related to the first embodiment of the present invention may be provided with four sub-pixels 10a including a roughly L shaped light emitting region and a roughly L shaped corner part of the light emitting region together are provided in a corner part of each square shaped pixel 10. The light emitting region in each sub-pixel 10a shown in FIG. 3A is formed by stacking a first electrode 11 of the light emitting device layer 1, a light emitting layer 12 and a second electrode 12. A first insulating layer 14 is provided above the first electrode 11 and the first electrode 11 and light emitting layer 12 are connected via an aperture part which exposes the first electrode 11 of the first insulating layer 14. In addition, a second insulating layer 15 including a certain thickness (for example, 1 micrometer or more) is provided above the first insulating layer 14 in a region where the aperture part which exposes the first electrode 11 is not formed. The second insulating layer 15 is provided in a region where the light emitting region of each sub-pixel 10a is not formed and may also be provided at roughly the center of a pixel 10 as is shown in FIG. 3A.

The structure of the display device 100 is described in detail while referring to FIG. 3B. FIG. 3B is a cross-sectional diagram of the line A-A' of the pixel 10 shown in FIG. 3A. As is shown in FIG. 3B, the substrate 2 is formed by stacking a resin layer 21, a first insulation film 22, a wiring layer 23, a second insulation film 24 and a planarization film 25 above a glass substrate 20.

The resin layer 21 is formed above the entire surface of the glass substrate 20 using as resin such as polyimide or polyester. The first insulation film 22 is formed using silicon nitride, silicon oxide or a stacked film comprised from silicon nitride and silicon oxide for example above the resin layer 21. The wiring layer 23 is provided with a metal plurality of metal wires formed using titanium and aluminum etc. The second insulation film 24 an inorganic insulation film formed from silicon nitride etc. covering the wiring layer 23. The planarization film 25 is formed using a resin such as polyimide or acrylic etc. above the second insulation film 24.

The glass substrate 20 is used as a support substrate of the resin layer 21 during a manufacturing process and the display device 100 may be formed by finally peeling the glass substrate 20 from the resin layer 21. In this way, the display device 100 related to one embodiment of the present invention is not formed using the hard glass substrate 20 but a flexible display device 100 may be formed the first substrate 7 and second substrate 6 using the resin layer 21 including flexibility. On the other hand, the display device 100 may also be formed by not arranging the resin layer 21 but by forming each structure 22–25 of the substrate 2 except the resin layer 21 above the glass substrate 20.

As is shown in FIG. 3B, the first electrode 11 of the light emitting device layer 1 is formed using a transparent conducting film such as ITO above the substrate 2. The first electrode 11 of the light emitting device layer 1 is connected to a wire of the wiring layer 23 via a contact hole formed in the second insulation film 24 and planarization film 25. In this way, the first electrode 11 of the light emitting device layer 1 and the source-drain electrode of a transistor formed corresponding to each pixel 10 are electrically connected.

After the first insulating layer 14 is formed covering the first electrode 11 above the first electrode 11, an aperture part exposing a part of the first electrode 11 is formed corresponding to the light emitting region of each sub-pixel 10a in the first insulating layer 14. The light emitting layer 12 and second electrode 13 are formed stacked above a region in which a part of the first electrode 11 is exposed by this aperture part in a manufacturing process described herein. In this way, the first insulating layer 14 may be a layer which functions as a bank layer which sections each light emitting region formed by stacking the first electrode 11, light emitting layer 12 and second electrode 13 in each sub-pixel 10a.

The second insulating layer 15 including a certain thickness is formed in a region in which a light emitting region of each pixel 10a is not formed at a roughly center part of the pixel 10 above the first insulating layer 14. The first insulating layer 14 and second insulating layer 15 are formed using a resin such as acrylic or polyimide etc.

The structure and manufacturing process of the first insulating layer 14 and second insulating layer 15 are explained in detail below while referring to FIG. 4A and FIG. 4B.

Although the second insulating layer 15 is exemplified as being provided only at roughly the center part of a pixel 10 in FIG. 3B, the second insulating layer 15 may be formed to be thicker at the center part of a pixel 10 by patterning after being provided over the entire surface of the first insulating layer 14.

As is shown in FIG. 3B and FIG. 4A, the second insulating layer 15 provided above the first insulating layer 14 at the center of a pixel 10 may have a pillar shape including a side surface with an angle close to perpendicular with respect to a horizontal surface of the second substrate 2. In addition, as is shown in FIG. 4B the second insulating layer 15 may have a mountain shape including a gentle slanting side surface. In this way, as long as the second insulating layer 14 has a certain thickness and includes a concave shape protruding from the horizontal surface of the substrate 2, there is no limitation t9 the structure shown in FIG. 3A, FIG. 3B, FIG. 4A and FIG. 4B. This type of second insulating layer 15 is preferred to have a tape shape or reverse taper shape which includes a side surface having an angle of 45 degrees or more with respect to a horizontal surface.

The second insulating layer 15 having this shape is formed by patterning a photosensitive resin. For example, a resin such as acrylic or polyimide may be used as the photosensitive resin. In addition, the first insulating layer 14 may also be formed by patterning using the same material as the second insulating layer 15. A contact hole which exposes a part of the first electrode 11 may be formed by patterning corresponding to the light emitting region of each sub-pixel 10a after the first insulating layer 14 and second insulating layer 15 are formed.

The light emitting layer 12 is formed by a vacuum deposition method using a metal mask above the second insulating layer 15. When the light emitting layer is formed using a vacuum deposition method, it is possible to obtain a region 3b in which the light emitting layer 12 is not formed on the side wall of the second insulating layer 15 as is shown in FIG. 4B.

The second electrode 13 is formed using a vacuum deposition method or sputtering method above the light emitting layer 12. The second electrode 13 is formed by forming a transparent conductive film such as IZO. In the case where the second electrode 13 is formed using a vacuum deposition method, it is possible not to form the second electrode 13 above a region 3b of a side surface of the second insulating layer 15 as is shown in FIG. 4B.

In addition, the second electrode may be formed using a sputtering method. In this case, the second electrode 13 is formed above the region 3b of the side surface of the second insulating layer 15. Furthermore, although the light emitting layer 12 and second electrode 13 are shown as one layer and a structure in which the second electrode 13 is not formed above a side surface of the second insulating layer 15 the same as the light emitting layer 12 are shown in FIG. 4A and FIG. 4B, the second electrode 13 may also be formed covering the region 3b using a sputtering method.

The sealing film 3 is formed above the second electrode 13 formed in this way. The sealing film 3 is formed so as to cover the entire surface of the substrate 2 formed with the light emitting device layer 1 using an inorganic insulation film such as silicon nitride or silicon oxide by a CVD (Chemical Vapor Deposition) method or ALD (Atomic Layer Deposition) method. In this way, it is possible to form the sealing film 3 on the region 3b of the side surface of the second insulating layer 15 as shown in FIG. 4B by using a CVD method or ALD method which have good covering properties even above the substrate 2 formed with a concave-convex shape using the second insulating layer 15.

In this way, the sealing film 3 formed covering the entire surface of the substrate 2 formed with the light emitting device layer 1 is formed contacting the second insulating layer 15 in the region 3b which is not formed with the light emitting layer 12 and second electrode 13 above a side surface of the second insulating layer 15 as is shown in FIG. 4B. The adhesion properties at the boundary between the sealing film 3 and second insulating layer 15 comprised from an inorganic film and organic film can be increased compared to the boundary between the light emitting layers 12 and second insulating layer 15 which are mutually comprised from an organic film. Therefore, the sealing film 3 which has higher adhesion properties than the light emitting layer 12 with respect to the second insulating layer 15 can be adhered to the second insulating layer 15 in the region 3b and can be formed to cover the entire surface of the light emitting layer 12 and second electrode 13. In this way, because the light emitting device layer 1 is sealed by a single layer of the sealing film 3 and because it is possible to provide a more rigid fix of the light emitting device layer 1 using the sealing film 3 by due to high adhesion properties of the part where the sealing film 3 and second insulating layer 15 are adhered, it is possible to control peeling of the light emitting device layer 1.

In addition, as described above, even in the case where the second electrode 13 is formed in the region 3b above the side surface of the second insulating layer 15, the adhesion properties at the boundary between the second electrode 13 and second insulating layer 15 comprised from a conducting film and organic film respectively can be made higher than the adhesion properties at the boundary between the light emitting layer 12 and second insulating layer 15 mutually comprised from an organic material. Therefore, even in the case where the second electrode 13 is formed in the region 3b, it is possible to control peeling of the light emitting layer 12 due to the high adhesion properties of the part where the second electrode 13 and second insulating layer 15 are adhered the same as in the case where the sealing film 3 is formed in the region 3b above the side surface of the second insulating layer 15.

In this way, it is possible to form the region 3b in which the light emitting layer 12 is not formed above the side surface of the second insulating layer 15 by forming the light emitting layer 12 using a vapor deposition method above the second insulating layer 15 provided at roughly the center of a pixel 10. That is, because the light emitting layer 12 is formed using a vapor deposition method. The evaporated material in vapor deposition method can be wraparound to the around area of the deposition surface. Therefore, if the second insulating layer 15 is formed using a resin such as acrylic which can be easily patterned and alignment shift can be reduced to about 1 μm, it is possible to easily form a desired taper shape and form the light emitting layer 12 in the region 3b in one part above a side wall of the second insulating layer 15 using the properties of vapor deposition. It is possible to form the region 3b in which the second insulating layer 15 and sealing film 3 or second electrode 14 are in direct contact on a side wall of the second insulating layer 15 when the sealing layer 3 or second electrode 13 are formed using a method with superior wrap around such as a CVD method or ALD method after forming the light emitting layer 12. Therefore, because the region 3b has higher adhesion properties than other regions via the light emitting layer 12, it is possible to control the occurrence of peeling of the light emitting layer 12.

As described above, according to the display device 100 related to the first embodiment of the present invention and the manufacturing method of the display device 100, it is possible to provide a display device 100 which prevent interlayer peeling between layers adjacent to the light emitting layer 12 and secure a high level of reliability. In addition, it is possible to realize a simple structure of the display device 100 without significantly modifying the manufacturing process.

In addition, the display device 100 related to the first embodiment of the present invention is not limited to the pixel 10 described while referring to FIG. 3A, FIG. 3B, FIG. 4A and FIG. 4B and structures of other pixels 10 can be applied. Examples of other structures of a pixel 10 are explained below while referring to FIG. 5A, FIG. 5B, FIG. 6A and FIG. 6B.

Figure 5A:
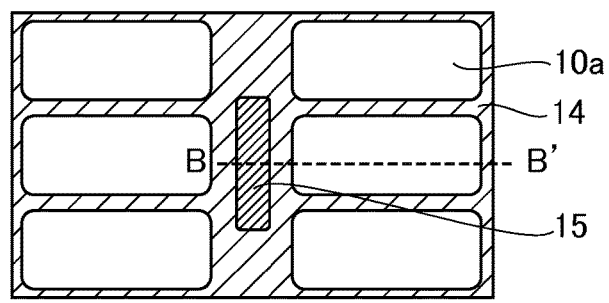
FIG. 5A is a planar diagram showing a another example of a pixel included in a display device related to one embodiment of the present invention.
Figure 5B:
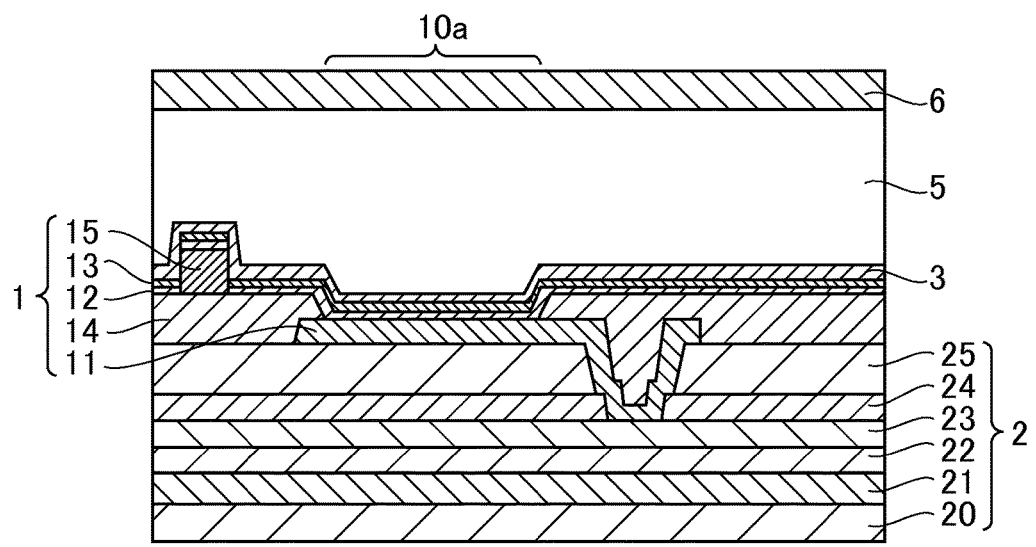
FIG. 5B shows another example of a pixel included in a display device related to one embodiment of the present invention, and is a cross-sectional diagram of the line B-B' shown in FIG. 5A.
Figure 6A:
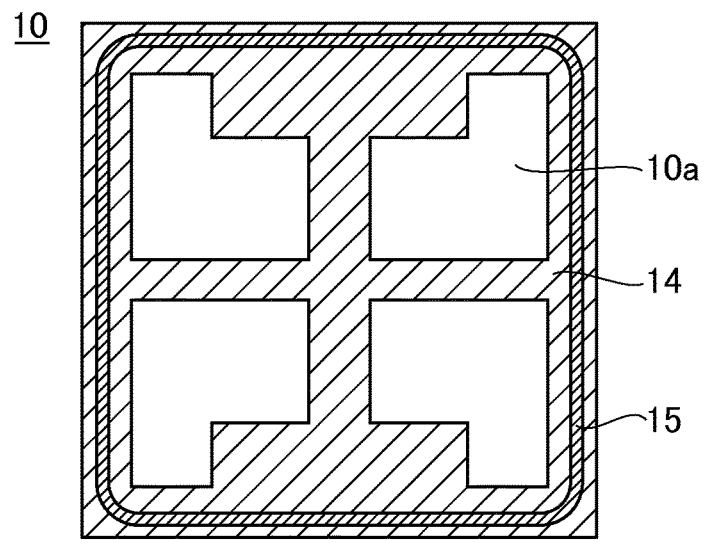
FIG. 6A and FIG. 6B are planar diagrams showing another example of a pixel included in a display device related to one embodiment of the present invention.
Figure 6B:
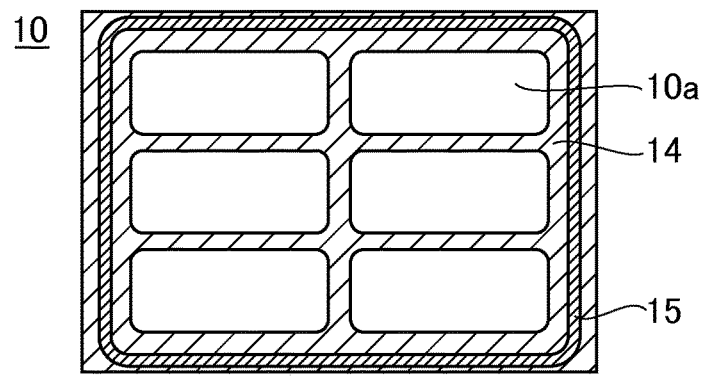

FIG. 5A is a planar diagram of a pixel 10 showing another example of a pixel 10 included in the display device 100 related to the first embodiment of the present invention. FIG. 5B is a cross-sectional diagram of the line B-B' shown in FIG. 5A. FIG. 6A and FIG. 6B are planar view diagrams showing another example of a pixel 10 included in the display device 100 related to the first embodiment of the present invention.

As is shown in FIG. 5A, the pixel 10 included in the display device 100 related to the first embodiment of the present invention may be formed by a group of six sub-pixels 10a, and at this time, the second insulating layer 15 may be provided between three sub-pixels 10a and another three opposing sub-pixels 10a at roughly the center of the pixel 10.

In addition, as is shown in FIG. 6A, a frame shaped second insulating layer 15 may be provided enclosing four sub-pixels 10a in a non-light emitting region of the pixel 10. In addition, as is shown in FIG. 6B, a frame shaped second insulating layer 15 may be provided enclosing six sub-pixels 10a.

In this way, the second insulating layer 15 can be provided in various positions as long as it is a non-light emitting region of the pixel 10. In addition, the number of sub-pixels 10a provided in a pixel 10 is not limited to the structures shown in the diagrams, for example, a pixel 10 is possible provided with three primary color RGB sub-pixels 10a. In the structure of the pixel 10 exemplified in FIG. 5A, FIG. 5B, FIG. 6A and FIG. 6B, a part can be formed where the sealing film 3 or second electrode 13 formed covering the light emitting layer 12 and a side wall of the second insulating layer 15 are adhered the same as the structure of the pixel 10 exemplified in FIG. 3A, FIG. 3B, FIG. 4A and FIG. 4B. By adopting this structure, it is possible to prevent interlayer peeling between layers adjacent to the light emitting layer 12 and provide a display device 100 in which a high level of reliability can be secured.

Second Embodiment

A display device 100 related to a second embodiment of the present invention is described below while referring to FIG. 7A and FIG. 7B.

Figure 7A:
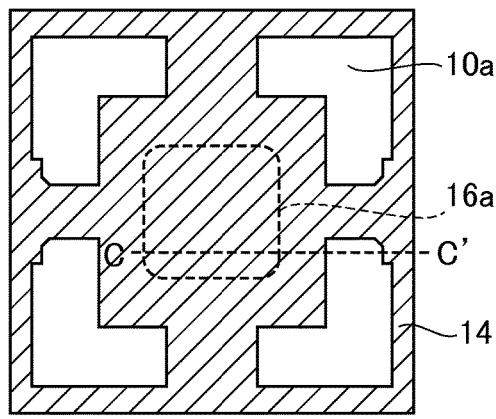
FIG. 7A is a planar diagram showing a schematic structure of a pixel included in a display device related to a second embodiment of the present invention.
Figure 7B:
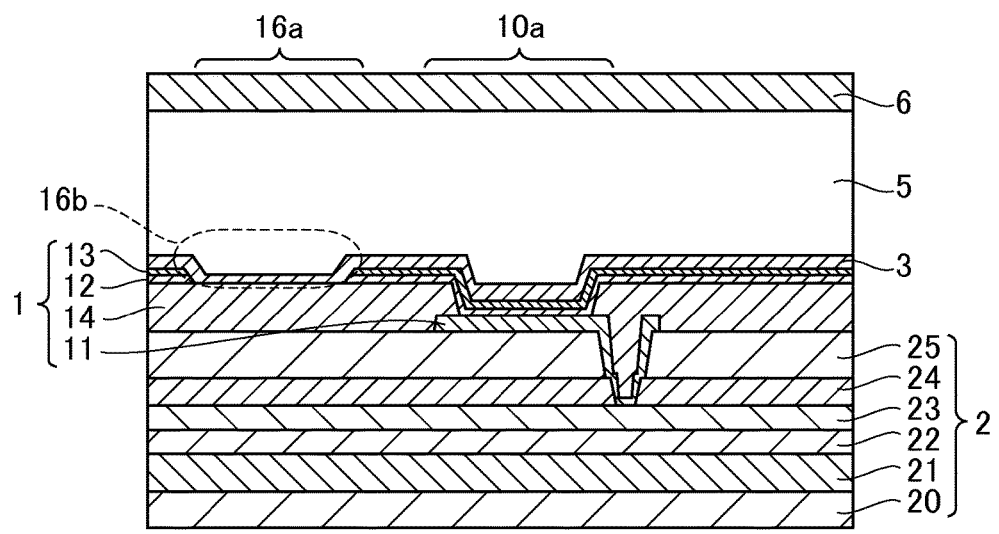
FIG. 7B shows a schematic structure of a pixel included in a display device related to a second embodiment of the present invention, and is a cross-sectional diagram of the line C-C' shown in FIG. 7A.

FIG. 7A and FIG. 7B is a diagram showing a schematic structure of a pixel 10 included in the display device 100 related to the second embodiment of the present invention, FIG. 7A is a planar view diagram of the pixel 10 and FIG. 7B is a cross-sectional view diagram of the line C-C' shown in FIG. 7A.

As is shown in FIG. 7A, a pixel 10 included in the display device 100 related to the second embodiment of the present invention may be provided with a structure in which four sub-pixels 10a including a roughly L shape light emitting region are provided with a roughly L shaped corner part of the light emitting region aligned in each square shaped corner part of a pixel 10 the same as the pixel 10 included in the display device 100 related to the first embodiment of the present invention. In addition, the pixel 10 included in the display device 100 related to the second embodiment of the present invention has a different structure to the pixel 10 included in the display device 100 related to the first embodiment of the present invention in that the second insulating layer 15 is not included. Below, the same reference symbols are attached to the same structural device of the pixel 10 included in the display device 100 related to the first embodiment of the present invention and a detailed explanation of these devices is omitted.

As is shown in FIG. 7B, after a light emitting region of each sub-pixel 10a is sectioned and the light emitting layer 12 and second electrode 13 are formed above the first insulating layer 14 which exposes the first electrode 11, the light emitting layer 12 and second electrode 13 of a non-light emitting region in which a light emitting region of each sub-pixel 10a is not formed are removed using an existing method such as irradiating a laser beam. In this way, an aperture part is formed in which the first insulating layer 14 is exposed from the light emitting layer 12 and second electrode 13 as is shown in the range enclosed by the dotted line 16b in FIG. 7B. By forming the sealing film 3 to cover the light emitting device layer 1 above the light emitting device layer 1 provided with this aperture part, a region 16a is formed in which the sealing film 3 and first insulating layer 14 are in direct contact.

The region 16a in which the sealing film 3 and first insulating layer 14 are in direct contact can be formed with higher adhesion properties compared to the adhesion properties at the boundary between the light emitting layer 12 and first insulating layer 14 mutually comprised from an organic film. Therefore, the sealing film 3 with higher adhesion properties than the light emitting layer 12 with respect to the first insulating layer 14 can be adhered to the first insulating layer 14 in the region 16a and can be formed to cover the entire surface of the light emitting layer 12 and second electrode 13. In this way, because the light emitting device layer 1 can be sealed using a single sealing film 3 and the because the light emitting device layer 1 can be fixed more rigidly by the sealing film 3 using the high adhesion properties of a part where the sealing film 3 and second insulating layer 15 are adhered, it is possible to control peeling of the light emitting device layer 1.

In this way, according to the display device 100 related to the second embodiment of the present invention, it is possible to realize a simple structure which can prevent peeling of the light emitting device layer 1 without significant modification of a manufacturing process the same as the display device 100 related to the first embodiment of the present invention.

In addition, the structure of the pixel 10 of the display device 100 related to the second embodiment of the present invention is not limited to the structure of the pixel 10 shown in FIG. 7A and FIG. 7B. For example, in the structure of the pixel 10 described above in FIG. 6A and FIG. 6B, the region 16a in which the sealing film 3 and first insulating layer 14 are in contact may be provided at a position in which the second insulating layer 15 is provided. In addition, after forming the light emitting layer 12, a structure may be adopted in which a part of the light emitting layer 1 is removed using laser beam irradiation etc. to expose the first insulating layer 14, and the second electrode 13 formed above the light emitting layer 12 may be in direct contact with the first insulating layer 14 in the region 16a. In this way, by arranging the region 16a in which the sealing film 3 or second electrode 13 and the first insulating layer 14 are in direct contact, it is possible to control the occurrence of peeling of the light emitting layer 12 in the display device 100 related to the second embodiment of the present invention.

As describe above, the display device 100 related to the first and second embodiments of the present invention and the manufacturing method of the display device 100 can be provided in which interlayer peeling between the light emitting layer 12 and adjacent layers can be prevented and a high level of reliability can be secured. In addition, this display device 100 can be realized using a simple structure and at reduced cost without significant modification of the manufacturing process.

What is claimed is:
1. A display device comprising:
   a first substrate provided with a pixel, the pixel provided with a light emitting region of a light emitting device formed by stacking a first electrode, a light emitting layer and a second electrode;
   a first insulating layer having an opening exposing the first electrode at a position corresponding to the light emitting region and provided above the first electrode;

a second insulating layer having a certain thickness provided over the first insulating layer and away from the opening; and a sealing film provided covering the light emitting device and the second insulating layer, wherein the light emitting layer is provided directly above the first electrode, a first region between the opening and the second insulating layer, and a second region that is a top surface of the second insulating layer, the opening of the first insulating layer has an L shape along two sides of the second insulating layer, the second electrode extends from the first region to the second region continuously, the light emitting layer is discontinuous between the first region and the second region, a side surface of the second insulating layer and the second electrode are in contact with each other between the first region and the second region, and the second electrode is sandwiched between the side surface of the second insulating layer and the sealing film.

2. The display device according to claim 1, wherein the sealing film is comprised from silicon nitride or silicon oxide.

3. The display device according to claim 1, wherein the first insulating layer and the second insulating layer are comprised from a resin.

4. The display device according to claim 1, wherein the second electrode includes a conductive film allowing light to pass through.

5. The display device according to claim 1, further comprising a second substrate facing the first substrate,
wherein the first substrate and the second substrate are formed from a resin.

6. The display device according to claim 1, wherein the pixel includes a plurality of sub-pixels provided with the light emitting region and the second insulating layer is provided to be surrounded by the plurality of sub-pixels roughly at the center of the pixel.

7. The display device according to claim 1, wherein the second insulating layer includes a side surface roughly perpendicular to a horizontal surface of the first substrate.

8. The display device according to claim 1, wherein the second insulating layer includes a mountain shape having a gentle slanting surface.

9. The display device according to claim 1, wherein the second insulating layer includes a taper shape or a reverse taper shape including a side surface with a 45 degree angle or more with respect to a horizontal surface of the first substrate.

10. A display device comprising:
a first electrode;
a first insulating layer covering edges of the first electrode and having an opening exposing an upper surface of the first electrode;
a second insulating layer above the first insulating layer and exposing the upper surface of the first electrode;
a light emitting layer covering the upper surface of the first electrode and at least a part of the first insulating layer;
a second electrode above the first insulating layer, the light emitting layer, and a top surface of the second insulating layer; and
a sealing film covering the second electrode and the second insulating layer, wherein
the opening of the first insulating layer has an L shape along two sides of the second insulating layer,
the second electrode extends from above the second insulating layer to above the exposed upper surface of the first electrode continuously,
the light emitting layer has an interrupted portion at a side surface of the second insulating layer, and
the second electrode and the side surface of the second insulating layer are in contact with each other at the interrupted portion.

11. The display device according to claim 10, wherein
a plurality of light emitting devices are formed,
each of the plurality of light emitting devices is formed by stacking the first electrode, the light emitting layer, and the second electrode, and
the second insulating layer is between two light emitting devices.

12. The display device according to claim 10, wherein the first insulating layer and the second insulating layer are comprised from a resin.

* * * * *